US008238579B2

(12) United States Patent
Yamaguchi

(10) Patent No.: US 8,238,579 B2
(45) Date of Patent: Aug. 7, 2012

(54) INFORMATION PROCESSING APPARATUS

(75) Inventor: Makoto Yamaguchi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/961,228

(22) Filed: Dec. 6, 2010

(65) Prior Publication Data

US 2011/0158434 A1   Jun. 30, 2011

(30) Foreign Application Priority Data

Dec. 25, 2009 (JP) ................................ 2009-296316

(51) Int. Cl.
*H03G 3/00* (2006.01)
(52) U.S. Cl. ........... 381/109; 381/123; 338/89; 702/163
(58) Field of Classification Search .................. 381/109, 381/104, 150, 123, 106, 107, 17, 18, 19, 381/1, 56; 338/89, 68, 152, 150, 13, 118; 702/163, 158, 155, 127
See application file for complete search history.

(56) References Cited

U.S. PATENT DOCUMENTS

| | | | |
|---|---|---|---|
| 6,385,734 B2* | 5/2002 | Atkinson | 713/324 |
| 6,895,448 B2* | 5/2005 | Chan et al. | 710/14 |
| 6,919,928 B1 | 7/2005 | Kanayama | |
| 7,194,097 B2* | 3/2007 | Su et al. | 381/120 |
| 7,224,811 B1 | 5/2007 | Narusawa et al. | |
| 2003/0086683 A1 | 5/2003 | Morisawa | |
| 2006/0196347 A1 | 9/2006 | Iwata | |

FOREIGN PATENT DOCUMENTS

| | | |
|---|---|---|
| JP | 07-272526 | 10/1995 |
| JP | 11-150788 | 6/1999 |
| JP | 11-271041 | 10/1999 |
| JP | 2003-140879 | 5/2003 |
| JP | 2005-115550 | 4/2005 |
| JP | 2006-246259 | 9/2006 |

OTHER PUBLICATIONS

Japanese Patent Application No. 2009-296316; Notice of Reasons for Rejection; Mailed Feb. 22, 2011 (English translation).

* cited by examiner

*Primary Examiner* — Vivian Chin
*Assistant Examiner* — Con P Tran
(74) *Attorney, Agent, or Firm* — Blakely, Sokoloff, Taylor & Zafman LLP

(57) ABSTRACT

According to one embodiment, an information processing apparatus includes a volume operation module, a first volume controller and a second volume controller. The volume operation module includes a rotary encoder module of detecting a degree of movement of a control member thereof and a potentiometer module of detecting an absolute position of the control member. The first volume controller controls the volume of the audio signal based on the detected degree of movement of the control member. The second volume controller controls the volume of the audio signal based on the detected absolute position of the control member. The volume control by the first volume controller is rendered effective when the information processing apparatus is in a power-on state. The volume control by the second volume controller is rendered effective when the information processing apparatus is in a power-off state.

7 Claims, 4 Drawing Sheets

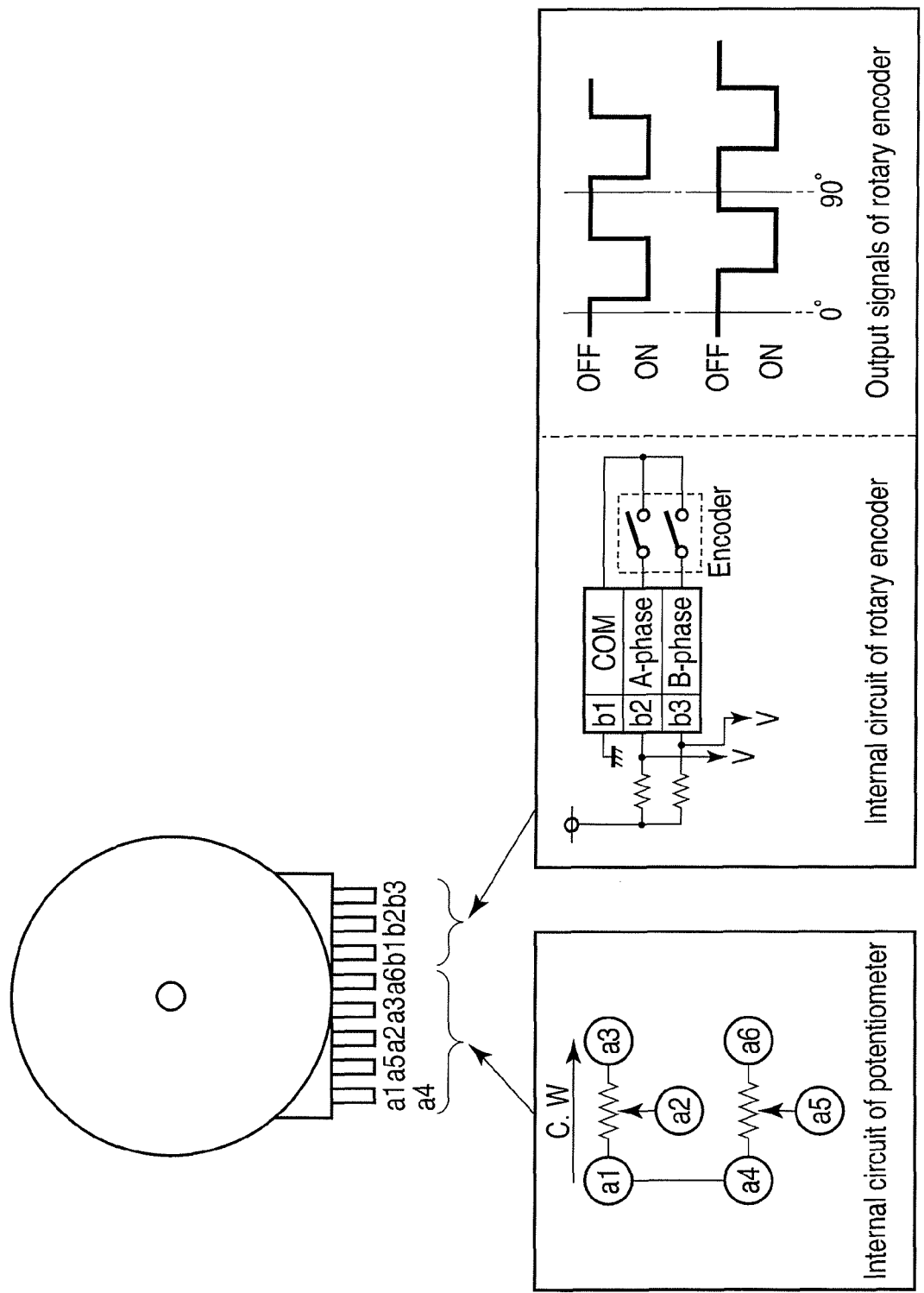
F I G. 4

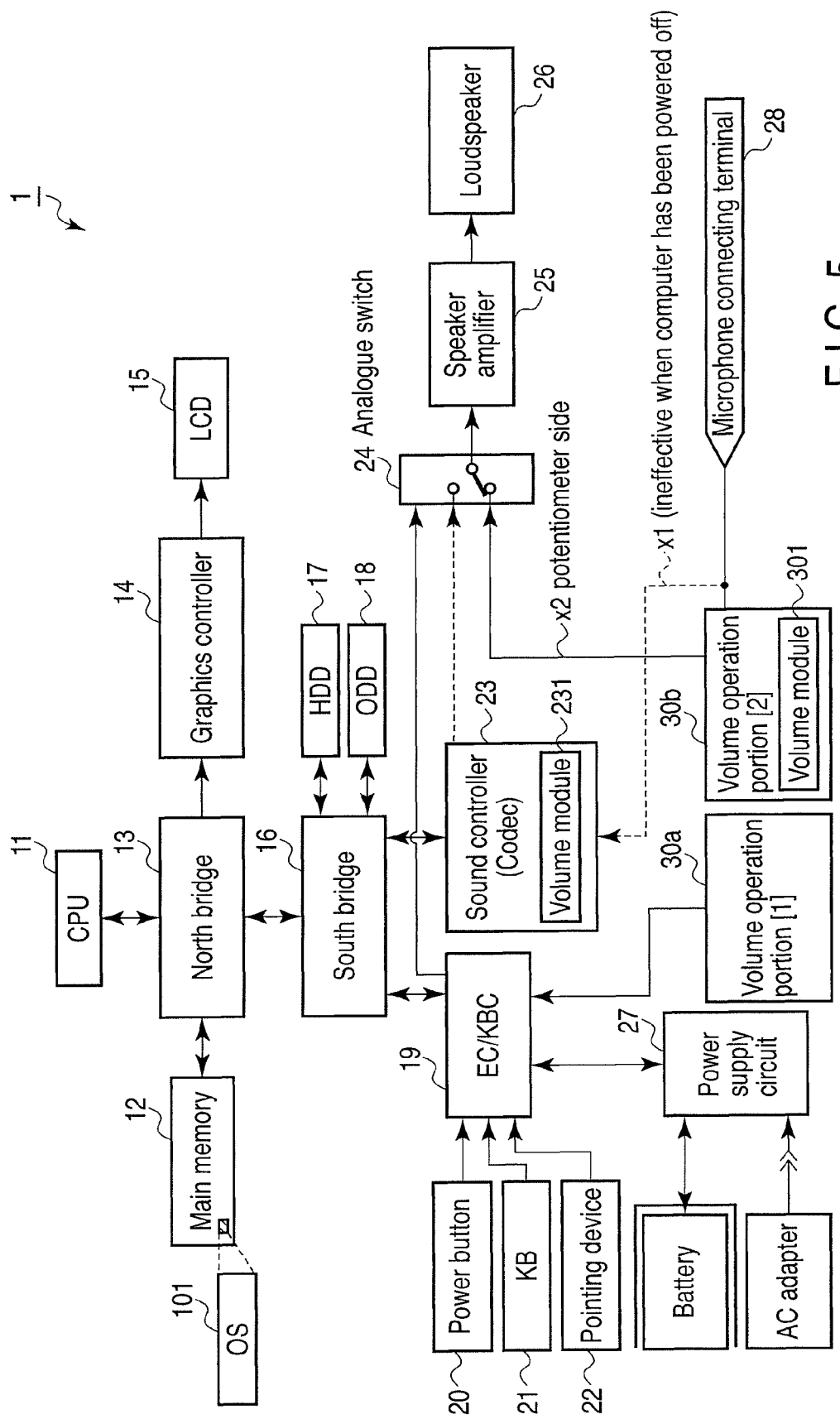
F I G. 5

INFORMATION PROCESSING APPARATUS

CROSS-REFERENCE TO RELATED APPLICATIONS

This application is based upon and claims the benefit of priority from Japanese Patent Application No. 2009-296316, filed Dec. 25, 2009; the entire contents of which are incorporated herein by reference.

FIELD

Embodiments described herein relate generally to a volume control technique suitable for, for example, personal computers such as notebook computers.

BACKGROUND

In recent years, all-in-one notebook computers have come into widespread use. Computers of this type often includes a high-quality display and high-quality speakers to allow users to view movies with high picture quality or listen to music with high sound quality.

At the same time, portable music players which allow users, by means of headphones or earphones, to easily listen to music whenever they want without bothering others have also come into widespread use. It has also become customary to listen to music from such a player by connecting speakers to the player and listening through the speakers instead of through headphones or earphones.

Since high-performance speakers for connection to portable music players are expensive, users who own a notebook computer with high-performance speakers naturally desire to listen to music from the player by connecting the player to the notebook computer and using the speakers of the computer.

In a notebook computer including a volume knob, it is easy to control the volume of the music output from the speakers. Various processing methods concerning a control member such as a volume knob have been proposed in the prior art (for example, see Jpn. Pat. Appln. KOKAI Pub. No. 11-271041).

However, when the notebook computer is off, listening to music from a portable music player through the speakers of the computer is impossible. This is because recent notebook computers are configured such that software, in the form of an operating system (OS), performs all resource management including volume control. Therefore, in a notebook computer including a volume knob, a signal indicating the position of the knob is input to the OS, and volume control is performed under control of the OS. Consequently, when the computer is off, so that volume control by software is impossible, listening to music from a portable music player through the speakers of the computer is impossible. Thus, to listen to music, the user has to turn the computer on merely to use the speakers.

Jpn. Pat. Appln. KOKAI Pub. No. 11-271041 discloses a "position detection apparatus which does not need initial setting work to be performed when the power is turned on, has good linearity in the relationship between the detected position and the output signal, and can achieve high reliability and reduction in cost", but does not address allowing the user to control volume on a personal computer configured such that, the OS performing all resource management, volume control by software is impossible when the computer is off.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 4 is an exemplary diagram illustrating a wiring structure of the volume control module of the information processing apparatus of the embodiment.

FIG. 5 is an exemplary diagram illustrating a modification of the system structure of the information processing apparatus of the embodiment.

DETAILED DESCRIPTION

Various embodiments will be described hereinafter with reference to the accompanying drawings.

In general, according to one embodiment, an information processing apparatus includes a loudspeaker, an input terminal, a volume operation module, a first volume controller, a second volume controller, a switch circuit and a controller. The input terminal is configured to receive an audio signal. The volume operation module is configured to adjust a volume of an audio signal to be output from the loudspeaker, and includes a rotary encoder module of detecting a degree of movement of a control member of the volume operation module and a potentiometer module of detecting an absolute position of the control member. The first volume controller is configured to control the volume of the audio signal received through the input terminal and to be output from the speaker, based on the degree of movement of the control member detected by the rotary encoder module of the volume operation module. The second volume controller is configured to control the volume of the audio signal received through the input terminal and to be output from the speaker, based on the absolute position of the control member detected by the potentiometer module of the volume operation module. The switch circuit is configured to perform switching in order to render one of volume control by the first volume controller and volume control by the second volume controller effective. The controller is configured to control the switch circuit such that the volume control by the first volume controller is rendered effective when the information processing apparatus is in a power-on state, and the volume control by the second volume controller is rendered effective when the information processing apparatus is in a power-off state.

Figure 1:
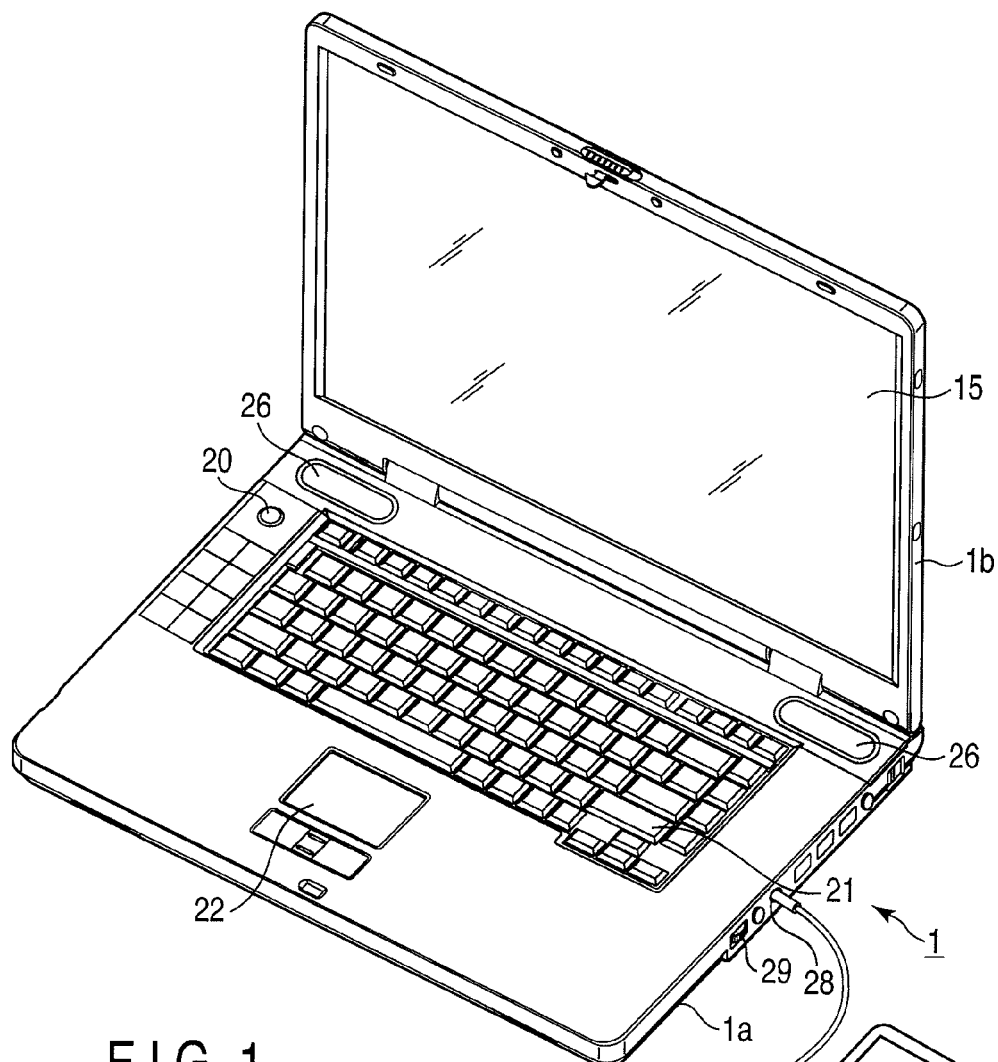
FIG. 1 is an exemplary external appearance diagram of an information processing apparatus according to an embodiment.

FIG. 1 is an exemplary external appearance diagram of an information processing apparatus according to the present embodiment. The information processing apparatus is realized as a notebook computer 1.

As illustrated in FIG. 1, the computer 1 includes a computer main body 1a and a display unit 1b. A liquid crystal display (LCD) 15 is incorporated into the display unit 1b. The display unit 1b is attached to the computer main body 1a such that the display unit 1b is rotatable between an opened position, in which an upper surface of the computer main body 1a is exposed, and a closed position, in which the display unit 1b covers the upper surface of the computer main body 1a.

On the other hand, the computer main body 1a has a thin box-shaped housing, and has the upper surface on which a power button 20, a keyboard 21, a pointing device 22, and loudspeakers 26 are arranged. In a side surface of the housing, a microphone connecting terminal 28 is disposed, and a volume knob (control member) of a volume operation portion 29 is exposed. The user can listen music data in a portable music player 2, using the loudspeakers 26 of the computer 1, by inputting an audio signal reproduced by the portable music player 2 through the microphone connecting terminal 28.

In addition, the user can control the volume of the audio signal, which has been input through the microphone connecting terminal 28 and is to be output from the loudspeakers 26, by operating the volume knob. The computer 1 enables the user to control the volume of the audio signal to be output from the loudspeakers 26 also when the computer 1 is in a power-off state (in which volume control by software control cannot be performed). This point will now be described in detail below.

Figure 2:
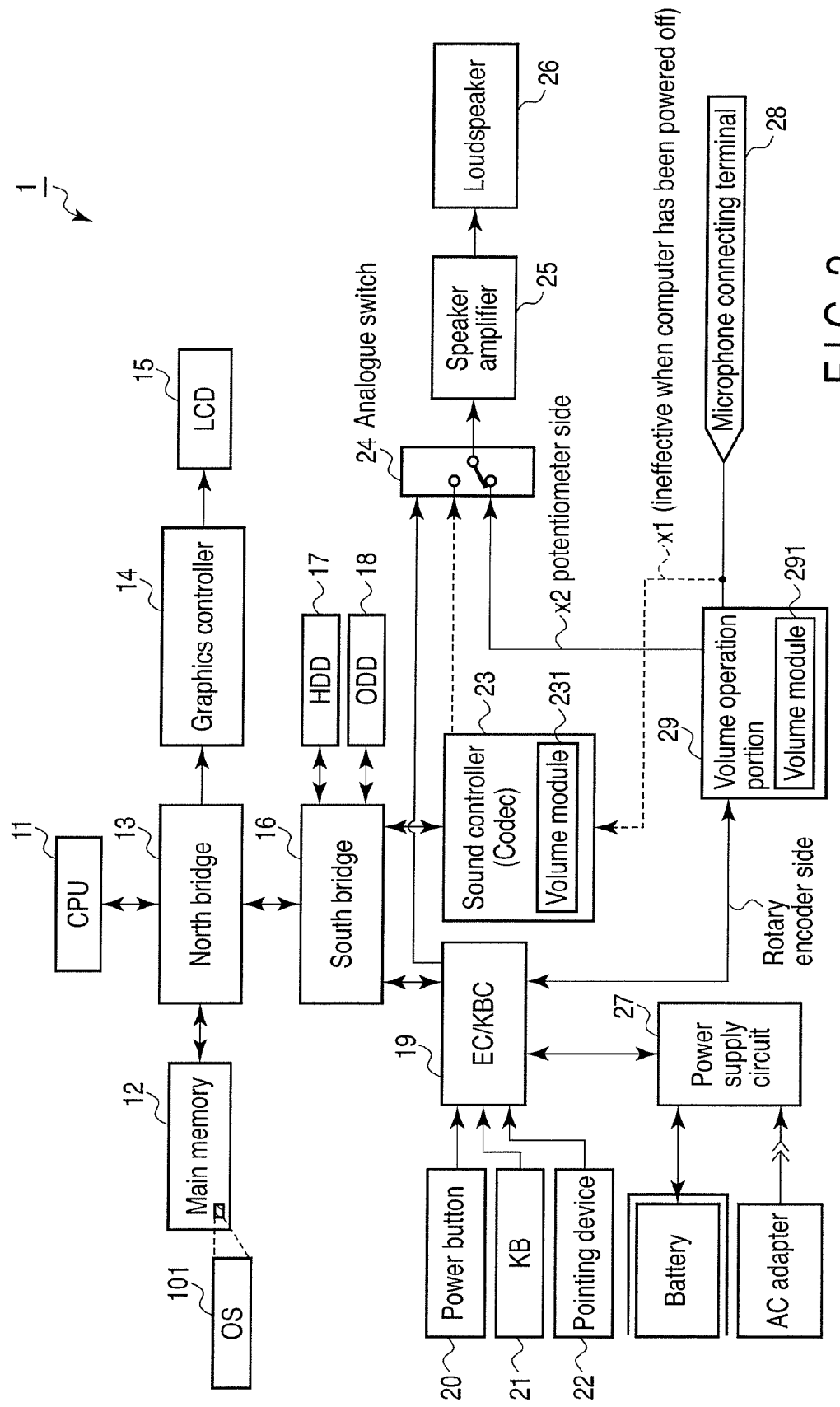
FIG. 2 is an exemplary diagram illustrating a system configuration of the information processing apparatus of the embodiment.

FIG. 2 is an exemplary diagram illustrating a system configuration of the computer 1. As illustrated in FIG. 2, the computer 1 includes a central processing unit (CPU) 11, a main memory 12, a north bridge 13, a graphics controller 14, the LCD 15, a south bridge 16, a hard disk drive (HDD) 17, an optical disc drive (ODD) 18, an embedded controller/keyboard controller (EC/KBC) 19, the power button 20, the keyboard (KB) 21, the pointing device 22, an audio controller (codec) 23, an analogue switch 24, a speaker amplifier 25, the loudspeakers 26, a power supply circuit 27, the microphone connecting terminal 28, and the volume operation portion 29.

The CPU 11 is a processor which controls operation of the computer 1, and executes various programs loaded from the HDD 17 and the ODD 18 into the main memory 12. One of the programs executed by the CPU 11 is an OS 101 which controls all resource management of the computer 1, including volume control of the audio signal to be output from the loudspeakers 26.

The north bridge 13 operates as a relay device which connects the CPU 11 with the south bridge 16, and as a memory controller which controls access to the main memory 12. The north bridge 13 also includes a function of performing communication with the graphics controller 14. The graphics controller 14 is a display controller which controls the LCD 15 incorporated into the display unit 1b.

The south bridge 16 includes an Integrated Device Electronics (IDE) controller to control the HDD 17 and the ODD 18. The south bridge 16 also includes a function of performing communication with the EC/KBC 19 and the sound controller 23.

The EC/KBC 19 is a one-chip microprocessing unit (MPU), in which an embedded controller to perform power control is integrated with a keyboard controller to control data input performed by operation of the keyboard 21, the pointing device 22 and the volume operation portion 29. In cooperation with the power supply circuit 27, the EC/KBC 19 performs control to supply various components of the computer 1 with power from a battery contained in the computer main body 1a or an AC adapter externally connected to the computer main body 1a. The EC/KBC 19 is supplied with operating power, even while the computer 1 is in a power-off state. The EC/KBC 19 includes a function of turning on or off the computer 1, in response to operation of the power button 20.

The sound controller 23 is an audio source device. The sound controller 23 plays back encoded audio data to be played back by the various programs, and outputs the generated analogue audio signal to the speaker amplifier 25. The sound controller 23 also includes a function of taking in an analogue audio signal which is input through the microphone connecting terminal 28, and outputting the signal to the speaker amplifier 25. The sound controller 23 includes a volume module 231 to perform volume control of the audio signal to be output to the speaker amplifier 25, in accordance with a command issued from the OS 101.

The (analogue) audio signal input through the microphone connecting terminal 28 is also guided to the volume operation portion 29 illustrated in FIG. 1. The volume operation portion 29 also includes a volume module 291 to control the volume of the audio signal to be output from the loudspeakers 26, and outputs a volume-controlled audio signal to the speaker amplifier 25. The analogue switch 24 is interposed between the speaker amplifier 25 and the sound controller 23 and the volume operation portion 29, and supplies an audio signal from one of the sound controller 23 and the volume operation portion 29 to the speaker amplifier 25, based on a control signal from the EC/KBC 19.

Specifically, as a route of outputting the audio signal input through the microphone connecting terminal 28 from the loudspeakers 26, the computer 1 has two routes, that is, a route ("x1") of passing through the sound controller 23, and a route ("x2") of passing through the volume operation portion 29 (without passing through the sound controller 23). When the computer 1 is in a power-off state, power supply to the sound controller 23 is cut off, and power supply to the CPU 11, the north bridge 13 and the south bridge 16 is also cut off. Consequently, it is impossible to perform volume control by the volume module 231 of the sound controller 23 under the control of the OS 101. Therefore, the EC/KBC 19 controls the analogue switch 24 to select route "x1" when the computer 1 is in the power-on state, and controls the analogue switch 24 to select route "x2" when the computer 1 is in the power-off state.

The following is a basic principle of control of the volume of the audio signal input through the microphone connecting terminal 28, which is applied to the audio signal when the audio signal is output from the loudspeakers 26.

Figure 3:
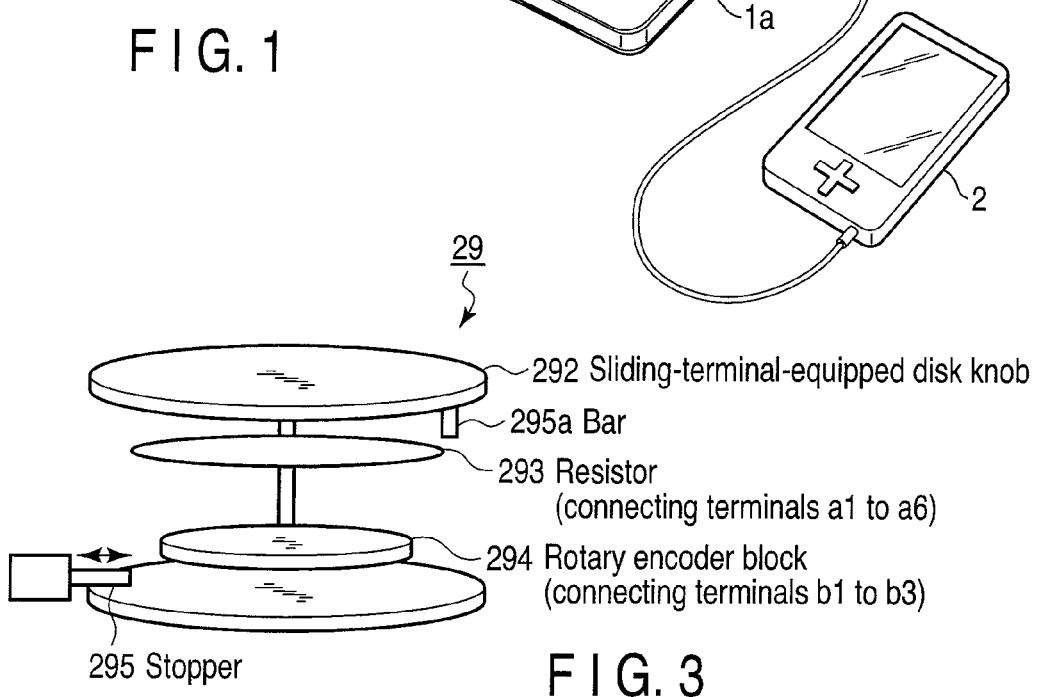
FIG. 3 is an exemplary diagram illustrating a structure of a volume control module provided in the information processing apparatus of the embodiment.

FIG. 3 is an exemplary diagram illustrating a structure of the volume operation portion 29.

The volume operation portion 29 which is included in the computer 1 includes a rotary encoder function (rotary encoder block) of detecting a degree of movement (displacement) of the control member, and a potentiometer function (potentiometer block) of detecting an absolute position of the control member together. As illustrated in FIG. 3, the volume operation portion 29 includes a sliding-terminal-equipped disk knob (volume knob) 292, a resistor 293, a rotary encoder block 294, a stopper 295 and the like.

The sliding-terminal-equipped disk knob 292 is a rotatable control member. The sliding-terminal equipped disk knob 292 is equipped with a bar 295a, and the angle of rotation of the knob 292 can be limited by the sliding stopper 295. The stopper 295 controls supply/cutoff of power to, for example, a coil-winding magnet placed in the volume operation portion 29, and is slid depending on whether the magnet is to be operated or not.

The resistor 293 is provided with connecting terminals (pins) "a1" to "a6", and the rotary encoder block 294 is provided with connecting terminals (pins) "b1" to "b3". FIG. 4 illustrates an exemplary wiring structure of the volume operation portion 29.

The pins "a1" to "a6" are connected to the potentiometer block. By rotation of the sliding-terminal-equipped disk knob 292, sliding contact points of the pins "a2" and "a5" move between the pins "a1" and "a3" and between the pins "a4" and "a6", respectively. Supposing that voltage is applied to the pins "a3" and "a6", the voltages of the moving pins "a2" and "a5" have values divided by resistance division according to the position thereof. Therefore, this change is used for volume control.

On the other hand, the pins "b1" to "b3" are connected to the rotary encoder block, and have a mechanism in which pulses are output from the pins "b2" and "b3" when the sliding-terminal-equipped disk knob 292 is rotated. The two pulses have phases which are shifted from each other by 90-degree. Since the difference in phase is also reversed when the rotation direction is reversed, the rotation direction of the knob 292 can be determined. Therefore, the waveforms of the pulses are decoded and used for up/down control of the volume.

When the computer 1 is in the power-on state, a device driver and a software program and the like operate as well as the OS 101, by using the CPU 11, the main memory 12, the north bridge 13, the south bridge 16 and the HDD 17. Volume control in this state is performed by using the rotary encoder function of the volume operation portion 29. A pulse signal output from the volume operation portion 29 is decoded by the EC/KBC 19, and the EC/KBC 19 issues a scan code to increase or decrease the volume to the OS 101. Thereby, the volume module 231 in the sound controller 23 is controlled under the control of the OS 101. In this control, the audio signal input through the microphone connecting terminal 28 is input to the sound controller 23 (through route "x1"), subjected to volume control, input to the speaker amplifier 25, and output from the loudspeakers 26.

On the other hand, when the computer 1 is in the power-off state, power supply to the CPU 11, the north bridge 13, the south bridge 16, the sound controller 23 and the like is cut off, and the OS 101 is not operated. Consequently, even when the EC/KBC 19 which has received the signal from the rotary encoder side issues a scan code, no software receives the scan code, and volume control cannot be performed.

Therefore, in such a case, the analogue switch 24 is changed over, such that the input signal input through the microphone connecting terminal 28 goes through the potentiometer (volume module 291) side of the volume operation portion 29, bypasses the sound controller 23, and is directly input to the speaker amplifier 25 (route "x2"). Then, the audio signal is output from the loudspeakers 26.

Thereby, it is possible to change the volume, even in the power-off state in which volume control by software control cannot be performed. In the meantime, when the volume operation portion 29 is used as potentiometer, since the potentiometer is a resistor, the potentiometer has the maximum/minimum values. Although the rotary encoder has no limitations to the angle of rotation since it only generates pulses, the angle of rotation of the volume operation portion 29 functioning as potentiometer must be limited at positions of the maximum/minimum resistance values.

Therefore, when the volume operation portion 29 is rendered function as potentiometer, the EC/KBC 19 controls supply/cutoff of power to the winding-coil magnet placed in the volume operation portion 29, to limit the angle of rotation of the volume operation portion 29. Specifically, the stopper 295 is slid to a position where the bar 295a provided on the sliding-terminal-equipped disk knob 292 is hooked.

Although the above embodiment shows an example in which the volume operation portion 29 includes the rotary encoder function together with the potentiometer function, it is possible to provide a volume control module functioning as rotary encoder and a volume control module functioning as potentiometer. FIG. 5 illustrates an exemplary system configuration example in which two volume operation portions are provided.

In FIG. 5, a volume operation portion [1] 30a only includes a rotary encoder function, and a volume operation portion [2] 30b only includes a potentiometer function. In a computer 1 having the system configuration, the user operates the volume operation portion [1] 30a when volume control of the audio signal input through the microphone connecting terminal 28 is performed in the power-on state, and the user operates the volume operation portion [2] 30b when volume control of the audio signal input through the microphone connecting terminal 28 is performed in the power-off state.

The system configuration also enables volume control of the audio signal to be output from the loudspeakers 26, in the power-off state in which volume control by software control cannot be performed.

In addition, it is possible to use a volume operation portion 29 including only a rotary encoder function, provide a digital potentiometer instead of the potentiometer block, and switch the volume control circuit. When this structure is adopted, it is unnecessary to provide the stopper 295 (and the bar 295a), and it is possible to set an intermediate value of a control range as a default value of the volume.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An information processing apparatus comprising:
a loudspeaker;
an input terminal configured to receive an audio signal;
a volume operation module configured to adjust a volume of an audio signal, the audio signal received through the input terminal and output from the loudspeaker, the volume operation module comprising a rotary encoder module detecting a degree of movement of a control member of the volume operation module and a potentiometer module detecting an absolute position of the control member;
a first volume controller configured to control the volume of the audio signal, the audio signal received through the input terminal and output from the loudspeaker, based on the degree of movement of the control member detected by the rotary encoder module of the volume operation module;
a second volume controller configured to control the volume of the audio signal, the audio signal received through the input terminal and output from the loudspeaker, based on the absolute position of the control member detected by the potentiometer module of the volume operation module;
a switch circuit configured to perform switching in order to render one of volume control by the first volume controller and volume control by the second volume controller effective; and a controller configured to control the switch circuit such that the volume control by the first volume controller is rendered effective when the information processing apparatus is in a power-on state in which the information processing apparatus is permitted to perform volume adjustment by software control, and the volume control by the second volume controller is rendered effective when the information processing apparatus is in a power-off state in which the information processing apparatus is inhibited from performing volume adjustment by software control.

2. The apparatus of claim 1, wherein:
the volume operation module comprises:
a stopper configured to set a movable range of the control member; and
a stopper control circuit configured to render the stopper effective or ineffective, and the controller is configured to control the stopper control circuit such that the stopper is rendered ineffective when the information processing apparatus is in the power-on state, and the stopper is rendered effective when the information processing apparatus is in the power-off state.

3. The apparatus of claim 1, further comprising:
a CPU;
a sound controller configured to decode encoded audio data;
a first data communication path configured to enable transmission of the audio signal received through the input terminal to the switch circuit via the sound controller; and
a second data communication path configured to enable transmission of the audio signal received through the input terminal to the switch circuit via the volume operation module and without via the sound controller, wherein:
the first volume controller is formed as a program, which is executed by the CPU, configured to control the volume of the audio signal transmitted through the first data communication path by controlling the sound controller in receipt of a signal indicating the degree of movement of the control member; and
the second volume controller is formed as an analogue circuit, which is included in the volume operation module, configured to control the volume of the audio signal transmitted through the second data communication path, in accordance with the absolute position of the control member.

4. The apparatus of claim 1, wherein:
the potentiometer module of the volume operation module is realized by a digital potentiometer; and
the second volume controller starts volume control of the audio signal, with an intermediate value of a control range used as an initial state.

5. An information processing apparatus comprising:
a loudspeaker;
an input terminal configured to receive an audio signal;
a first volume operation module configured to adjust a volume of an audio signal, the audio signal received through the input terminal and output from the loudspeaker, the first volume operation module comprising a rotary encoder module detecting a degree of movement of a control member of the first volume operation module;
a second volume operation module configured to adjust the volume of the audio signal, the audio signal received through the input terminal and output from the loudspeaker, the second volume operation module comprising a potentiometer module detecting an absolute position of a control member of the second volume operation module;
a first volume controller configured to control the volume of the audio signal, the audio signal received through the input terminal and output from the loudspeaker, based on the degree of movement of the control member of the first volume operation module detected by the first volume operation module;
a second volume controller configured to control the volume of the audio signal, the audio signal received through the input terminal and output from the loudspeaker, based on the absolute position of the control member of the second volume operation module detected by the second volume operation module;
a switch circuit configured to perform switching in order to render one of volume control by the first volume controller and volume control by the second volume controller effective; and
a controller configured to control the switch circuit such that the volume control by the first volume controller is rendered effective when the information processing apparatus is in a power-on state in which the information processing apparatus is permitted to perform volume adjustment by software control, and the volume control by the second volume controller is rendered effective when the information processing apparatus is in a power-off state in which the information processing apparatus is inhibited from performing volume adjustment by software control.

6. The apparatus of claim 5, further comprising:
a CPU;
a sound controller configured to decode encoded audio data;
a first data communication path configured to enable transmission of the audio signal received through the input terminal to the switch circuit via the sound controller; and
a second data communication path configured to enable transmission of the audio signal received through the input terminal to the switch circuit via the second volume controller and without via the sound controller, wherein:
the first volume controller is formed as a program, which is executed by the CPU, configured to control the volume of the audio signal transmitted through the first data communication path by controlling the sound controller in receipt of the degree of movement of the control member of the first volume operation module; and
the second volume controller is formed as an analogue circuit, which is included in the second volume operation module, configured to control the volume of the audio signal transmitted through the second data communication path, in accordance with the absolute position of the control member of the second volume operation module.

7. The apparatus of claim 5, wherein:
the potentiometer module of the second volume operation module is realized by a digital potentiometer; and
the second volume controller starts volume control of the audio signal, with an intermediate value of a control range used as an initial state.

* * * * *